United States Patent
Yeo et al.

(10) Patent No.: US 8,297,196 B2
(45) Date of Patent: Oct. 30, 2012

(54) APPARATUS FOR TRANSFERRING SUBSTRATES

(75) Inventors: Yeongjin Yeo, Gumi-si (KR); Seungheon Choi, Incheon (KR); Geejo Lee, Gyungsan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/095,556

(22) Filed: Apr. 27, 2011

(65) Prior Publication Data

US 2011/0200417 A1    Aug. 18, 2011

Related U.S. Application Data

(62) Division of application No. 12/155,005, filed on May 28, 2008, now Pat. No. 7,954,434.

(30) Foreign Application Priority Data

May 29, 2007    (KR) .......................... 10-2007-0051828

(51) Int. Cl.
*B60L 13/04* (2006.01)
(52) U.S. Cl. ......... 104/281; 104/283; 104/284; 104/290
(58) Field of Classification Search .................... 104/89, 104/94, 95, 281, 282, 283, 284, 290, 292
See application file for complete search history.

(56) References Cited

U.S. PATENT DOCUMENTS

| | | | | |
|---|---|---|---|---|
| 4,259,908 A * | 4/1981 | Feistkorn et al. | ............ | 104/281 |
| 4,646,651 A * | 3/1987 | Yamamura et al. | ........... | 104/281 |
| 5,259,603 A * | 11/1993 | Geisler et al. | .................... | 269/43 |
| 5,641,054 A * | 6/1997 | Mori et al. | ..................... | 198/619 |
| 5,651,318 A * | 7/1997 | O'Donohue | .................. | 104/124 |
| 5,704,493 A * | 1/1998 | Fujikawa et al. | ........... | 211/41.16 |
| 5,845,581 A * | 12/1998 | Svensson | ....................... | 104/120 |
| 6,304,311 B1 * | 10/2001 | Egami et al. | .................... | 349/189 |
| 6,471,459 B2 * | 10/2002 | Blonigan et al. | ................ | 414/217 |
| 7,318,517 B2 * | 1/2008 | Roder et al. | .................... | 198/619 |
| 7,410,109 B2 * | 8/2008 | Jeung et al. | .................... | 239/583 |
| 7,591,368 B2 * | 9/2009 | Cheng et al. | ................ | 198/750.2 |
| 7,659,963 B2 * | 2/2010 | Kweon et al. | .................. | 349/189 |
| 7,708,866 B2 * | 5/2010 | Kim et al. | ................ | 204/192.12 |
| 2002/0090287 A1 * | 7/2002 | Pelrine et al. | .............. | 414/749.2 |
| 2006/0011429 A1 * | 1/2006 | Park et al. | ................ | 188/322.13 |
| 2007/0045110 A1 * | 3/2007 | Kim et al. | ................ | 204/298.25 |
| 2008/0246901 A1 * | 10/2008 | Park | ................................ | 349/58 |
| 2008/0298947 A1 * | 12/2008 | Yeo et al. | ................... | 414/749.2 |
| 2009/0162179 A1 * | 6/2009 | Hosek et al. | ................ | 414/749.2 |
| 2011/0200417 A1 * | 8/2011 | Yeo et al. | ................... | 414/749.2 |

* cited by examiner

*Primary Examiner* — Jason C Smith
(74) *Attorney, Agent, or Firm* — McKenna Long & Aldridge, LLP

(57) ABSTRACT

An apparatus for transferring substrates includes a carrier to which substrates are loaded, an upper transfer unit transferring the carrier horizontally by applying thrust to the carrier, a lower transfer unit maintaining the lower body of the carrier at the horizontal in a non-contact status, a magnetic levitation module levitating the carrier magnetically, and a lower damper unit maintaining the lower center of gravity of the carrier levitated by the magnetic levitation module.

9 Claims, 10 Drawing Sheets

APPARATUS FOR TRANSFERRING SUBSTRATES

CROSS-REFERENCE TO RELATED APPLICATIONS

This application is a Divisional of application Ser. No. 12/155,005 filed May 28, 2008 now U.S. Pat. No. 7,954,434, now allowed, which claims priority to Korean Patent Application No. 10-2007-0051828, filed May 29, 2007, each of which are incorporated by reference in their entirety for all purposes as if fully set forth herein.

BACKGROUND OF THE INVENTION

1. Field of the Invention

The present invention relates to an apparatus for transferring substrates.

2. Description of the Related Art

Manufacturing semiconductor or flat panel displays such as liquid crystal displays and plasma displays requires a series of highly sophisticated processes.

Loading and unloading of wafers or substrates is be done to carry out each individual process. A method for transferring substrates into each process chamber by using a vertically moving carrier is utilized for the above loading and unloading.

FIG. 1 illustrates the structure of a conventional apparatus for transferring substrates.

As illustrated in FIG. 1, a carrier 13 comprises a loading unit 13C mounting substrates, an upper carrier bar 13A located inside a carrier guide 11A attached to an upper moving path, and a lower carrier bar 13B being in contact with a roller and driven for horizontal transfer by the movement of the roller.

The carrier 13 as above is transferred horizontally within a process chamber 10 or between chambers by an apparatus for transferring substrates comprising a upper transfer unit 11 and a lower transfer unit 12.

A conventional apparatus for transferring substrates has a problem that a lower carrier bar 13B attached to the roller of a lower transfer unit 12 is often displaced from the roller. Such a problem decreases yield, thereby reducing productivity.

In particular, since substrates are transferred being glued to a rotating roller, large friction force is generated and adverse effect due to particles may arise.

SUMMARY OF THE INVENTION

An aspect of this document is to provide an apparatus of non-contact type for transferring substrates, which can provide horizontal transfer of the upper and lower body of a carrier after magnetic levitation thereof.

In an aspect, an apparatus for transferring substrates comprises a carrier to which substrates are loaded, an upper transfer unit transferring the carrier horizontally by applying thrust to the carrier, a lower transfer unit maintaining the lower body of the carrier at the horizontal in a non-contact status, a magnetic levitation module levitating the carrier magnetically, and a lower damper unit maintaining the lower center of gravity of the carrier levitated by the magnetic levitation module.

In another aspect, an apparatus for transferring substrates comprises a carrier to which substrates are loaded, an upper transfer unit transferring the carrier horizontally by applying thrust to the carrier, a lower transfer unit maintaining the lower body of the carrier at the horizontal in a non-contact status, a magnetic levitation module levitating the carrier magnetically, and an upper damper unit maintaining the upper center of gravity of the carrier levitated by the magnetic levitation module.

In a yet another aspect, an apparatus for transferring substrates comprises a carrier to which substrates are loaded, an upper transfer unit transferring the carrier horizontally by applying thrust to the carrier, a lower transfer unit maintaining the lower body of the carrier at the horizontal in a non-contact status, a magnetic levitation module levitating the upper body of the carrier magnetically, a lower damper unit maintaining the lower center of gravity of the carrier levitated by the magnetic levitation module and an upper damper unit maintaining the upper center of gravity of the carrier levitated by the magnetic levitation module.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION OF THE ILLUSTRATED EMBODIMENTS

Reference will now be made in detail embodiments of the invention examples of which are illustrated in the accompanying drawings.

Figure 1:
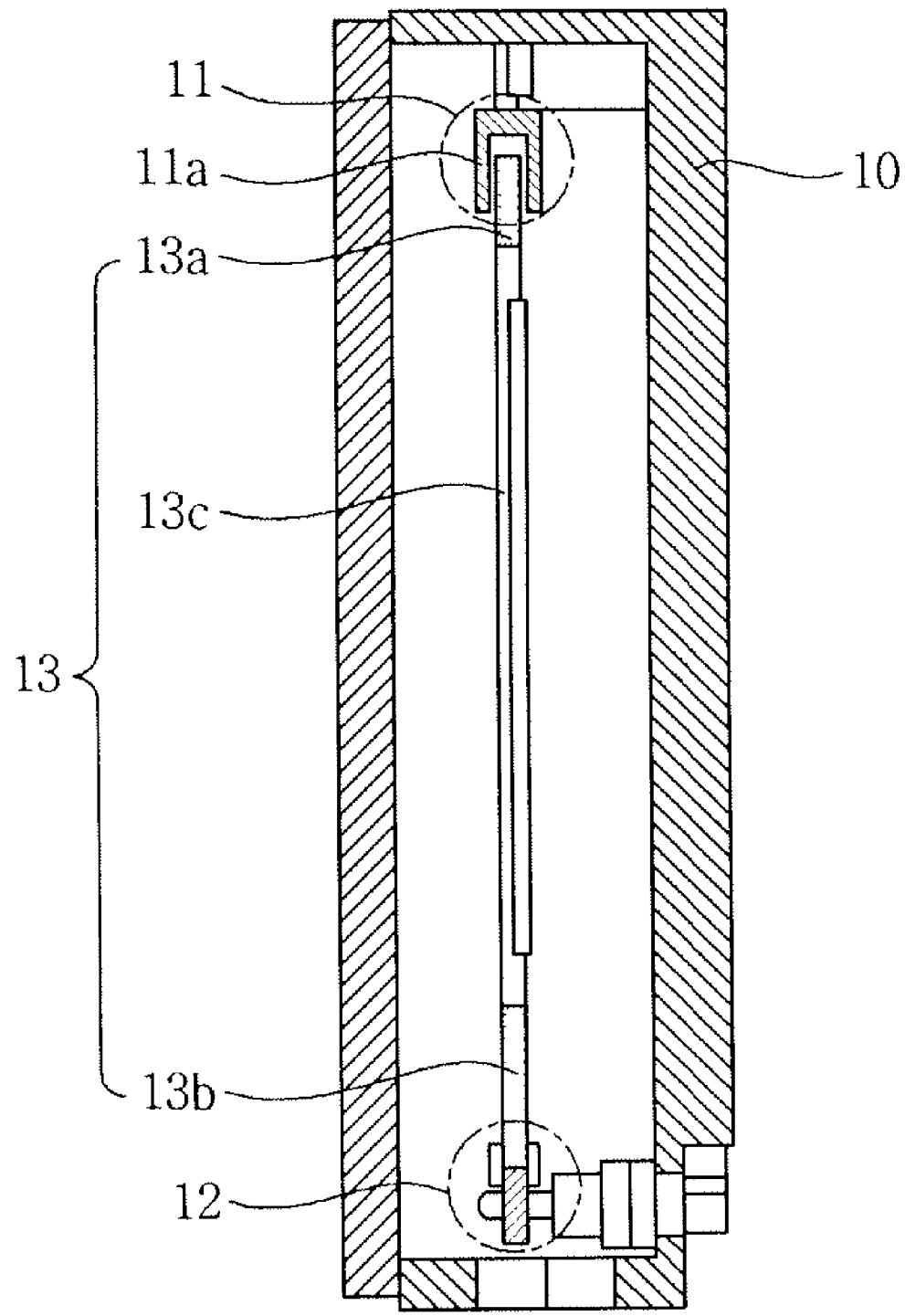
FIG. 1 illustrates the cross section of a conventional apparatus for transferring substrates.
Figure 2:
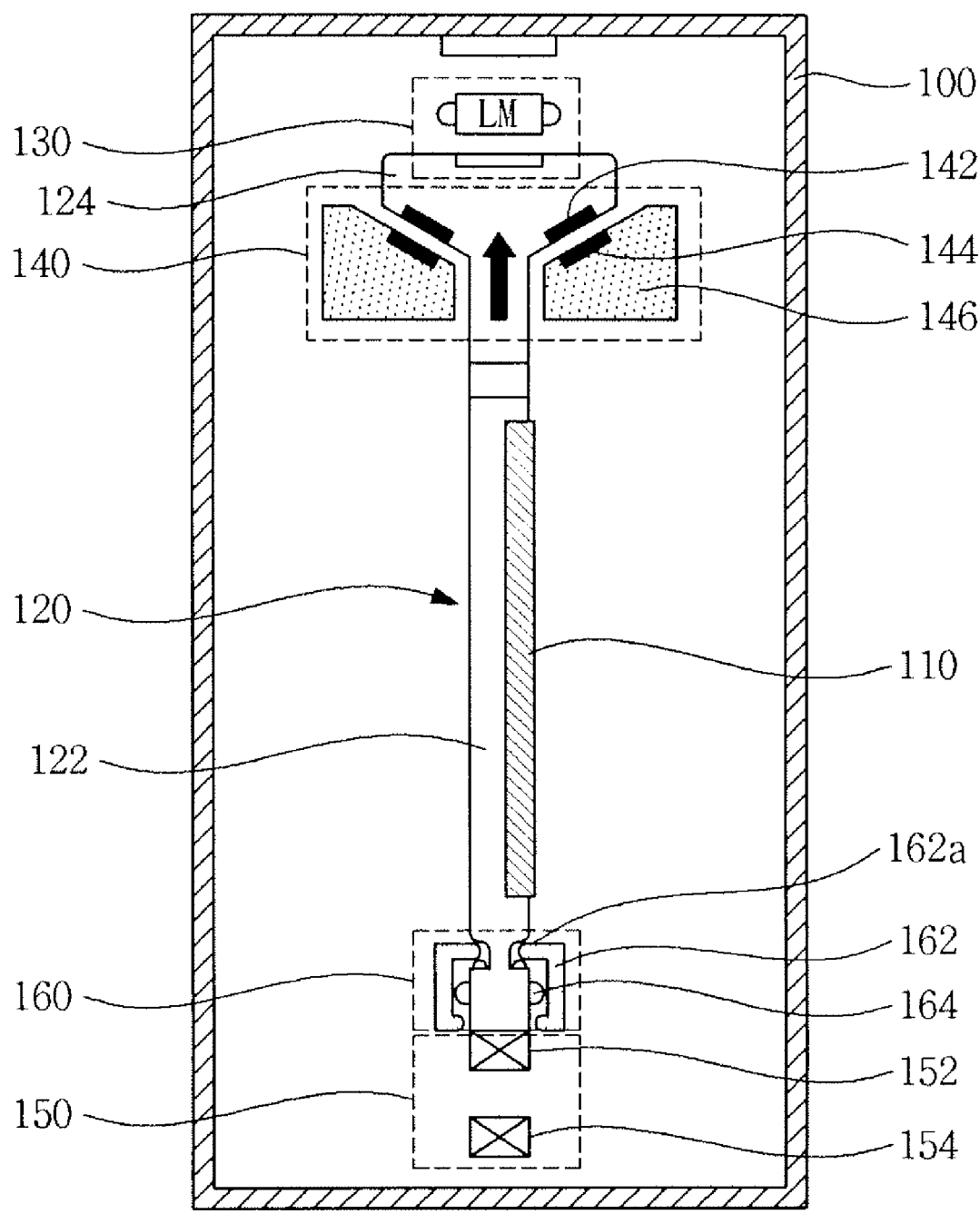
FIG. 2 illustrates an apparatus for transferring substrates according to a first embodiment of the invention.
Figure 3:
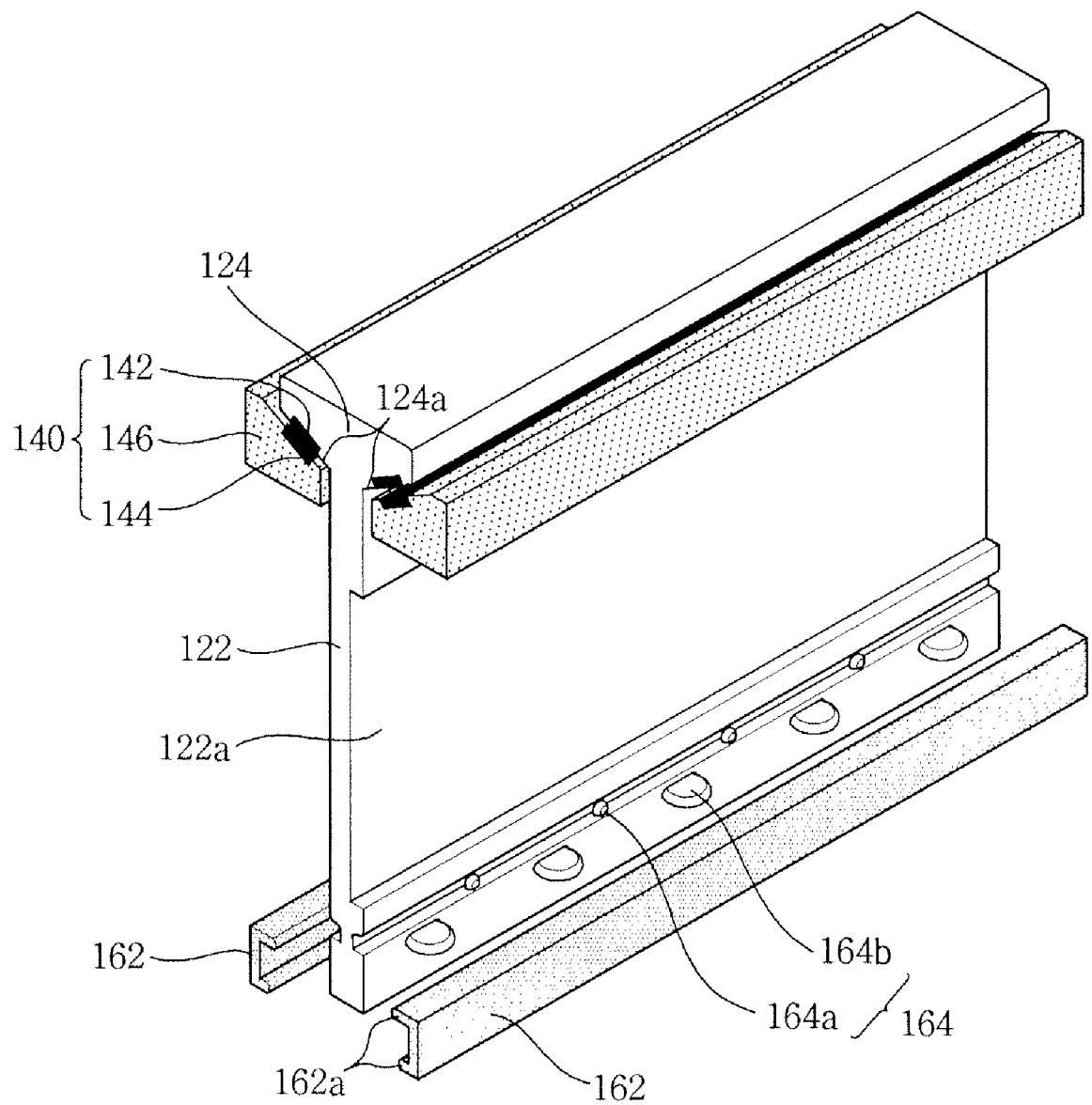
FIG. 3 illustrates a squint view of an apparatus for transferring substrates illustrated in FIG. 2.

FIG. 2 illustrates a cross section of an apparatus for transferring substrates according to a first embodiment of the invention. FIG. 3 illustrates a squint view of an apparatus for transferring substrates illustrated in FIG. 2 and FIG. 4 illustrates a front view of an apparatus for transferring substrates illustrated in FIG. 2.

Figure 4:
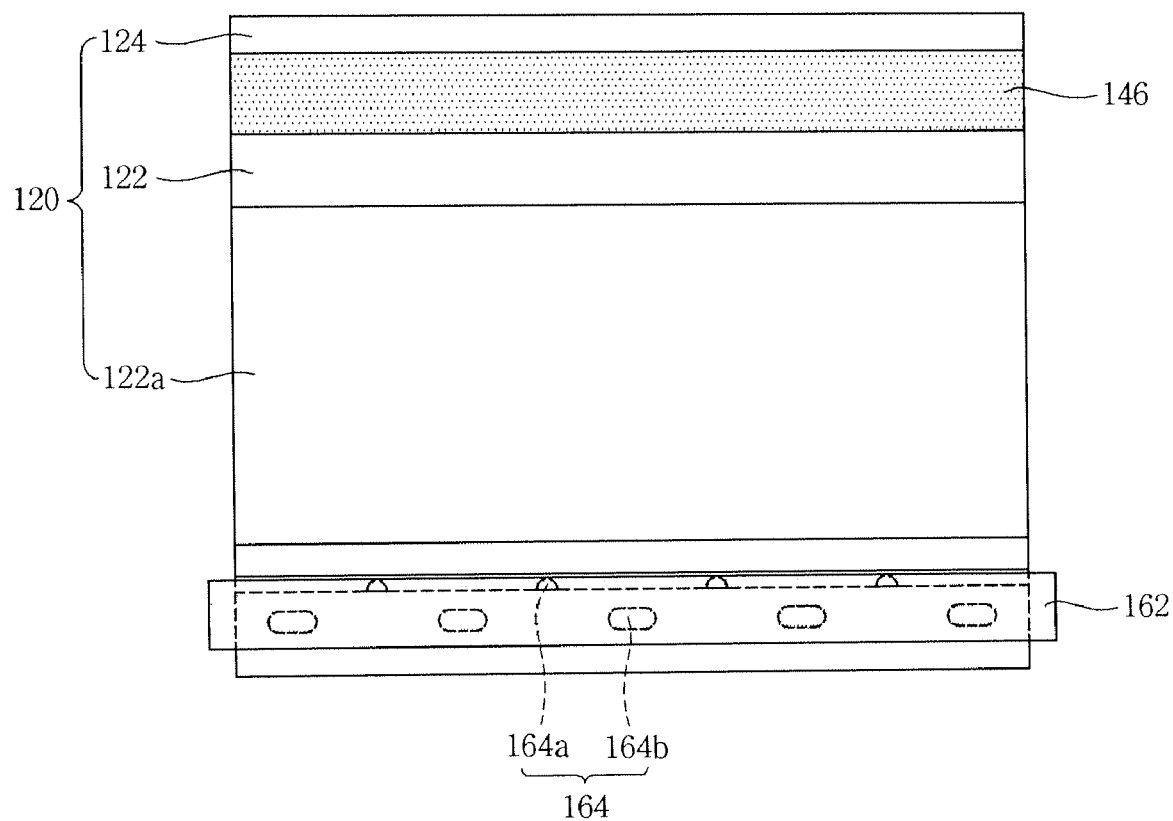
FIG. 4 illustrates a front view of an apparatus for transferring substrates illustrated in FIG. 2.

With reference to FIGS. 2 through 4, an apparatus for transferring substrates according to the first embodiment of the invention includes a carrier 120 to which substrates 110 are loaded; an upper transfer unit 130 transferring the carrier 120 horizontally, a lower transfer unit 150 maintaining the lower body of the carrier 120 at the horizontal in a non-contact status, a magnetic levitation module 140 levitating the carrier 120 magnetically, and a lower damper unit installed to the lower body of the carrier 120.

The carrier 120 includes a body 122 to which a substrate 110 is mounted vertically and a head 124 having an inclination part 124A whose diameter enlarges along upward direction at the upper part of the body 122.

Inside the body 122, a loading unit 122A for loading a substrate 110 is prepared.

Since the above carrier 120 transfers a substrate 110 by mounting the substrate 110 vertically as shown in the figure, it is effective from the standpoint of space utilization and substrate drooping.

The substrate 110 maybe for manufacturing flat panel displays as well as liquid crystal displays, which may further includes the case of a semiconductor wafer.

The upper transfer unit 130 applies thrust to the carrier 120 by using timing belt, rack and pinion gear, roller, ball screw, or linear motor, thereby transferring the carrier 120 horizontally.

In particular, when a linear motor is employed, the carrier 120 can be transferred horizontally in a non-contact way.

A linear motor includes a stator and an agitator. A stator may be formed by a plurality of coil arranged along moving direction of an agitator. The agitator may be formed by magnets arranged to stir the coil of the stator.

Accordingly, when current flows through the stator coil, the linear motor generates Lorenz force against the stator to move the agitator in a direction vertical to the ground. Due to the force, the agitator is moved horizontally relative to the agitator and the carrier 120 coupled to the agitator is moved horizontally.

The magnetic levitation module 140 is so structured that levitation force is generated by push force established between magnets.

As illustrated in FIGS. 2 and 3, the magnetic levitation module 140 includes a first permanent magnet 142 formed at the head 124 of the carrier 120 along the inclination part 124A, a second permanent magnet 144 installed opposite to the first permanent magnet 142, and a supporting member 146 supporting the second permanent magnet 144.

Since the second permanent magnet 144 has actually the same polarity as the first permanent magnet 142, push force is generated pushing the second permanent magnet 144 from the first permanent magnet 142.

The second permanent magnet 144 follows the size and shape of the first permanent magnet 142. The first permanent magnet 142 is either a single long magnet formed at the head 124 of the carrier 120 along the inclination part 124A or a set of magnets of a fixed size installed along the inclination part 124A.

Different from the moving mechanism of the magnetic levitation module 140 utilizing push force of a magnet, the lower transfer unit 150 maintains the carrier 120 at the horizontal being levitated magnetically from the ground by using push force of a magnet.

The above lower transfer unit 150 includes a third permanent magnet 152 installed in the lower body of the carrier 120 and a fourth permanent magnet 154 installed opposite to the third permanent magnet 152 and with polarity different from the third permanent magnet 152.

Since the fourth permanent magnet 154 is fixed to the bottom surface within a process chamber 100, the carrier 120 is maintained at the horizontal in a non-contact status by pull force exercised between the fourth permanent magnet 154 and the third permanent magnet 152.

At this time, the magnetic levitation module 140 and the lower transfer unit 150 require control of levitation force according to the weight of the carrier 120.

Recently, as the size of a substrate increases, the size of the carrier 120 also increases. Accordingly, the levitation force to levitate the carrier 120 should be increased and since the weight of the carrier 120 varies according to individual equipment, control of levitation force by adjusting levitation gap is required.

For example, if push force exercised by the magnetic levitation module 140 is strong relative to the weight of the carrier 120 whereas pull force exercised by the lower transfer unit 150 is weak relative to the push force, the lower body of the carrier 120 levitated magnetically may not be kept horizontal in a non-contact status, being inclined in one direction or displaced from the normal position.

The lower damper unit 160 is intended for controlling the levitation gap of the carrier 120. The lower damper unit 160 includes comprising a lower housing 162 encompassing both parts of the lower body of the carrier 120 and multiple dampers 164 installed inside the lower housing 162.

The lower housing 162 is installed to the front and the rear of the carrier 120, covering both sides of the carrier 120 by assembly. Alternatively, the lower housing 162 is installed in the form of a cap, covering both sides of the lower body of the carrier 120.

The lower housing 162 is fixed in a process chamber 100 and hooks 162A are installed at the upper and lower part thereof.

Hooks restrict levitation force of the carrier 120 levitated magnetically, thereby preventing the carrier 120 from being inclined in one direction due to magnetic force (push and pull force) exercised through the magnetic levitation module 140 and the lower transfer unit 150.

Multiple dampers 164 are prepared inside the lower housing 162 and surfaces facing opposite to each other come into contact with the carrier 120 and the inner surface of the lower housing 162, respectively.

To explain more specifically, multiple dampers 164 may include a first damper 164B installed between the side of the carrier 120 and the lower housing 162; and a second damper 164A installed between the hook 162A of the lower housing 162 and the carrier 120.

At this time, in one side of the carrier 120 with which multiple dampers 164 come into contact, grooves (not shown) into which part of the dampers 164 are inserted may be formed.

For example, multiple dampers 164 may be a roller.

In this case, the rotating axis of multiple dampers 164 is installed differently according to the installation position.

Figure 5:
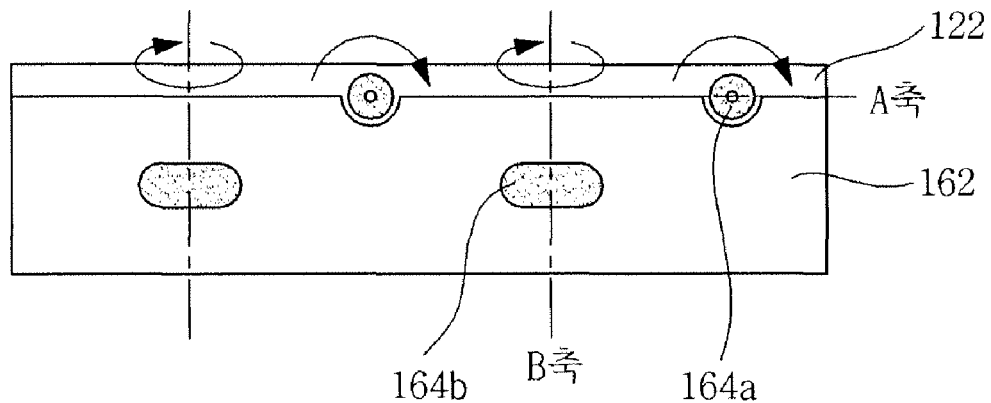
FIG. 5 illustrates the structure where a lower damper unit illustrated in FIG. 2 is installed.

In other words, with reference to FIG. 5, for the case of a first damper 164B installed between the side of the carrier 120 and the lower housing 162, multiple dampers are installed with an axis orthogonal to the direction of the carrier 120 (A axis) as the rotating axis. For the case of a second damper 164A installed between the hooks 162A of the lower housing 162 and the carrier 120, multiple dampers are installed with an axis orthogonal to the direction of levitation of the carrier 120 (B axis) as the rotating axis.

Accordingly, multiple dampers 164 keep the lower center of gravity of the magnetically levitated carrier 120 from being displaced from a normal position, minimize collision between the carrier 120 and the lower housing 162, and prevent generation of particles by minimizing friction between the carrier 120 and the lower housing 162.

Meanwhile, for the lower damper unit 160, magnetic force exercised to the upper and lower part of the carrier 120 varies according to external environment or the weight of the carrier 120. Accordingly, levitation force of the carrier 120 can be varied; for this case, the lower housing 162 can adjust levitation force of the carrier 120 through multiple dampers 164.

That is to say, the lower damper unit 160 can maintain levitation gap where the carrier 120 is levitated by interaction between multiple dampers 164. In particular, control of the levitation gap is made possible by restricting levitation force of the carrier 120 by utilizing the hooks 162A of the lower housing 162.

Figure 6:
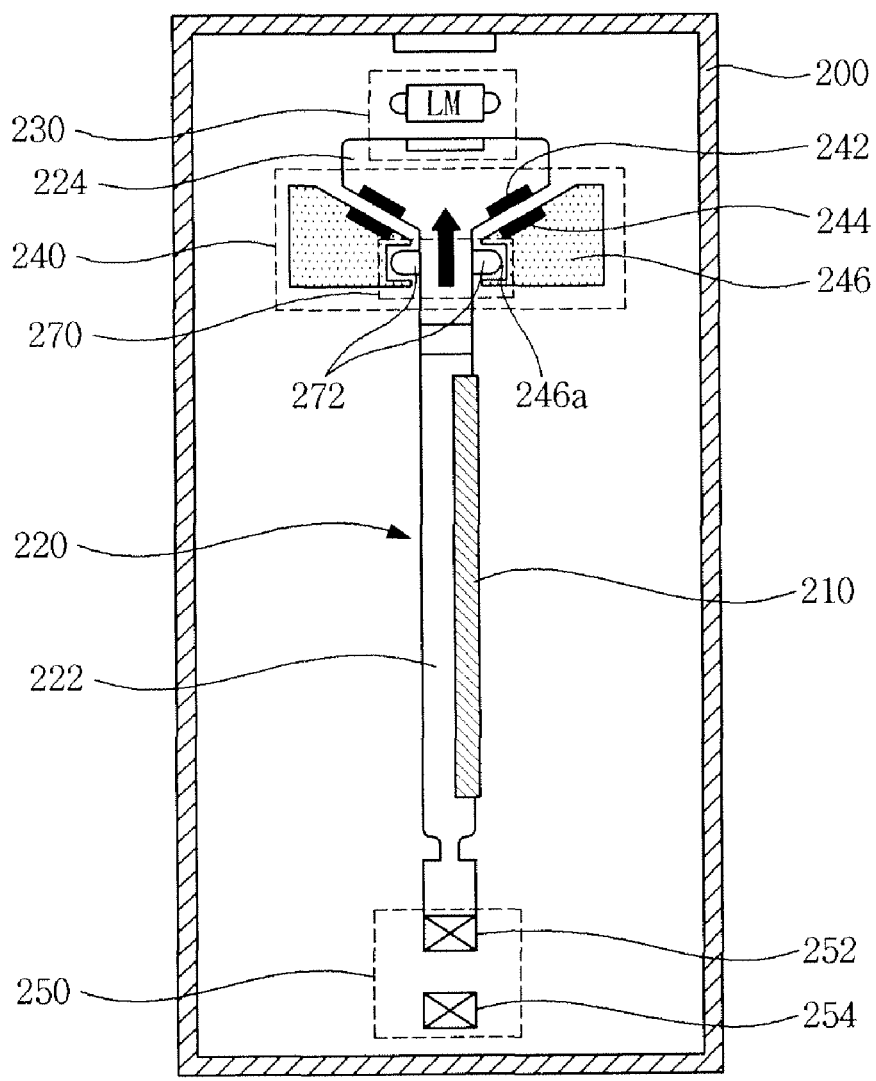
FIG. 6 illustrates an apparatus for transferring substrates according to a second embodiment of the invention.
Figure 7:
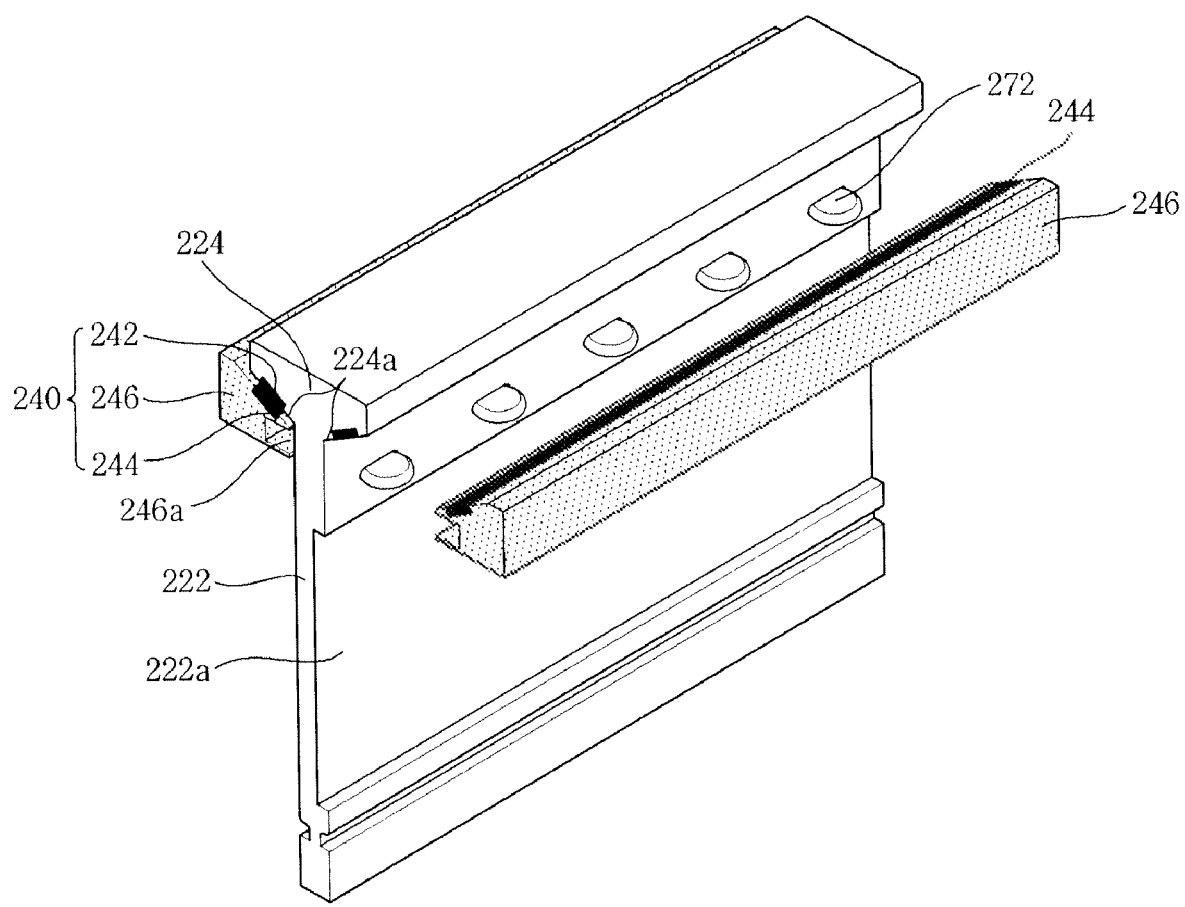
FIG. 7 illustrates a squint view of an apparatus for transferring substrates illustrated in FIG. 6.
Figure 8:
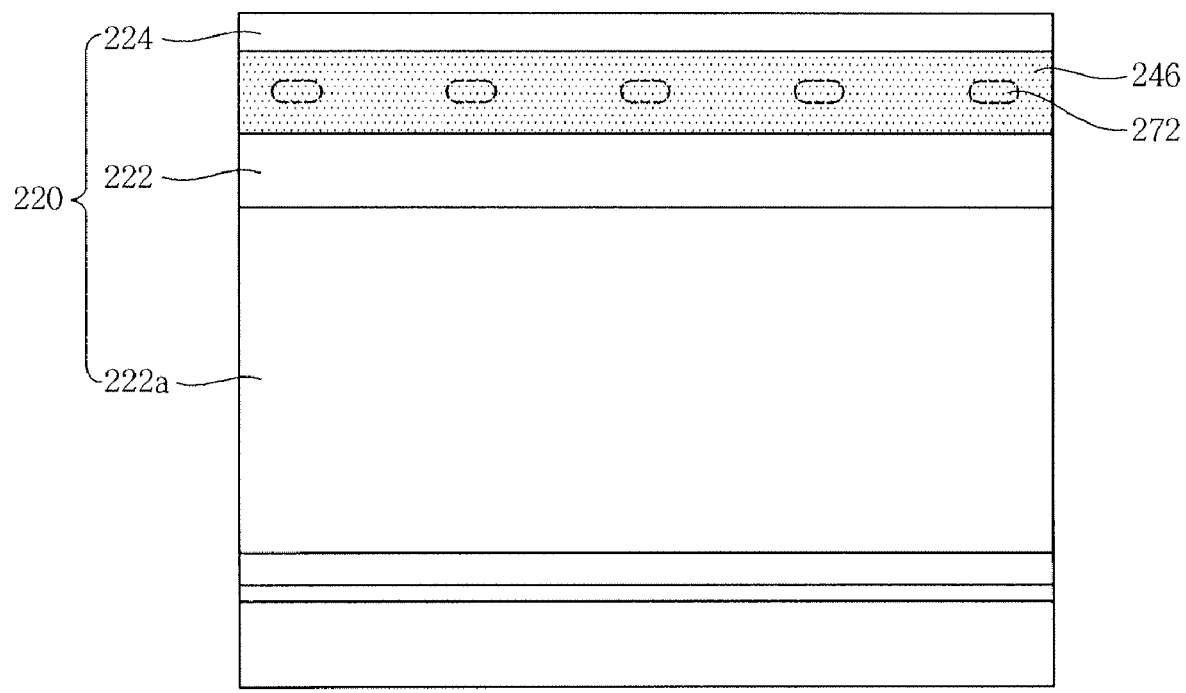
FIG. 8 illustrates a front view of an apparatus for transferring substrates illustrated in FIG. 6.

FIG. 6 illustrates a cross section of an apparatus for transferring substrates according to a second embodiment of the invention. FIG. 7 illustrates a squint view of the apparatus for transferring substrates illustrated in FIG. 6 and FIG. 8 is a front view of the apparatus for transferring substrates illustrated in FIG. 6.

An apparatus for transferring substrates according to a second embodiment of the invention transfers the carrier 220 horizontally by levitating the carrier 220 by using push force generated between magnets.

At this time, push force generating levitation force causes lateral force which inclines a subject in one direction as well as the levitation force. Such lateral force becomes large as the levitation force enlarges.

Accordingly, an apparatus for transferring substrates according to the second embodiment of the invention reduces inclination phenomena generated by lateral force by applying a damper at the upper part of the carrier 220, thereby providing a stable carrier conveyance system.

Referring to FIG. 6, an apparatus for transferring substrates according to the second embodiment of the invention includes a carrier 220 to which substrates 210 are loaded, an upper transfer unit 230 transferring the carrier 220 horizontally by applying thrust to the carrier 220, a lower transfer unit 250 maintaining the lower body of the carrier 220 at the horizontal in a non-contact status, a magnetic levitation module 240 levitating the carrier 220 magnetically, and an upper damper unit 270 maintaining the upper center of gravity of the carrier 220 levitated by the magnetic levitation module 240.

Hereinafter, description of components also used in an apparatus for transferring substrates according to the first embodiment is omitted; only components not found in the first embodiment are described.

A magnetic levitation module 240 of an apparatus for transferring substrates according to the second embodiment of the invention includes two permanent magnets 242, 244 and a supporting member 246 for generating levitation force by push force between magnets.

As illustrated in FIGS. 6 and 7, a first permanent magnet is installed at the head 224 of the carrier 220 along the inclination part 224A. The first permanent magnet 242 is either a single long magnet formed along the inclination part 224A or a set of magnets of a fixed size installed along the inclination part 224A.

Since the second permanent magnet 244 is installed opposite to the first permanent magnet 242 and has actually the same polarity as the first permanent magnet 242, push force is generated between the first permanent magnet 242 and the second permanent magnet 244.

The supporting member 246 is installed according to the head 224 shape of the carrier 220 and is located at the lower body of the inclination part 224A, supporting the second permanent magnet 244 installed opposite to the first permanent magnet 242.

The supporting member 246 has an inclination in such a way that the upper surface of the supporting member 246 facing the inclination part 224A correspond to the inclination part 224A and the side surface of the supporting member 246 facing the carrier 220 has a groove 246A.

The upper damper unit 270 is intended for preventing the carrier 220 levitated by the magnetic levitation module 240 from being inclined towards both sides by lateral force, the upper damper unit 270 including multiple dampers 272 installed along horizontal direction of the carrier 220.

To be more specific, multiple dampers 272 are installed between the supporting member 246 of the magnetic levitation module 240 and the carrier 220.

Therefore, surfaces of multiple dampers 272 facing each other make contact with the carrier 220 and the magnetic levitation module 240 respectively, maintaining the upper center of gravity of the carrier 220 levitated by the magnetic levitation module 240 against lateral force. Accordingly, since the center of gravity of the carrier 220 is kept at a right position not inclined towards both sides, generation of particles due to friction is prevented.

One of the surfaces of the carrier 220 with which multiple dampers 272 make contact may carry a groove (not shown) along which part of the dampers 272 can be inserted.

Each of the dampers 272 can be realized by a roller. As illustrated in the figure, a roller can be installed in a pair at both surfaces of the carrier 220 or each of the dampers 272 can be realized by a roller penetrating the carrier 220.

In this case, the roller is installed in such a way that the roller is rotated around an axis orthogonal to the direction of levitation of the carrier 220, thus reducing friction between the magnetic levitation module 240 and the carrier 220.

Moreover, since multiple dampers 272 make contact with the carrier 220 while being inserted in the groove 246A of the supporting member 246, displacement of multiple dampers 272 due to lateral force can be prevented.

Figure 9:
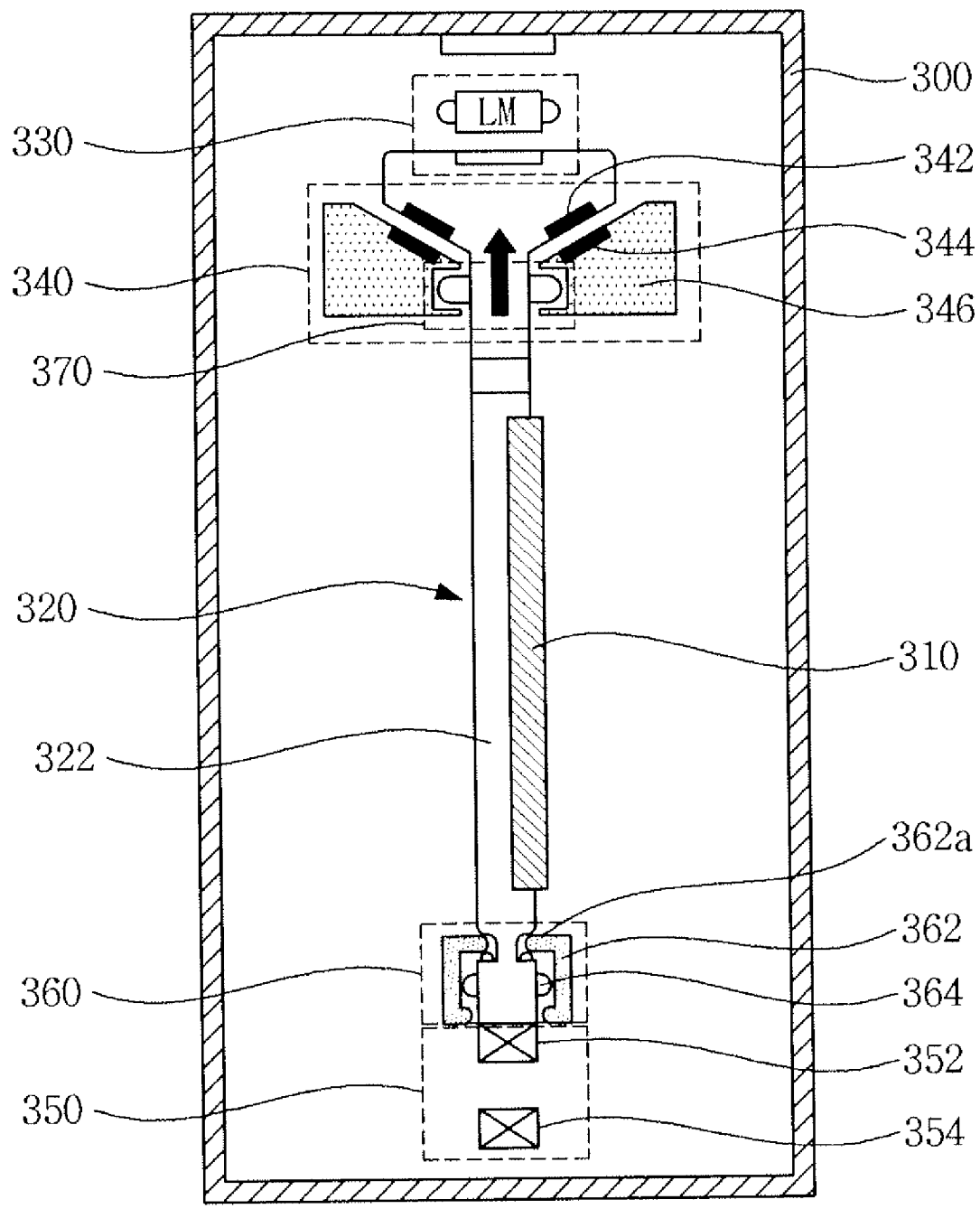
FIG. 9 illustrates an apparatus for transferring substrates according to a third embodiment of the invention.
Figure 10:
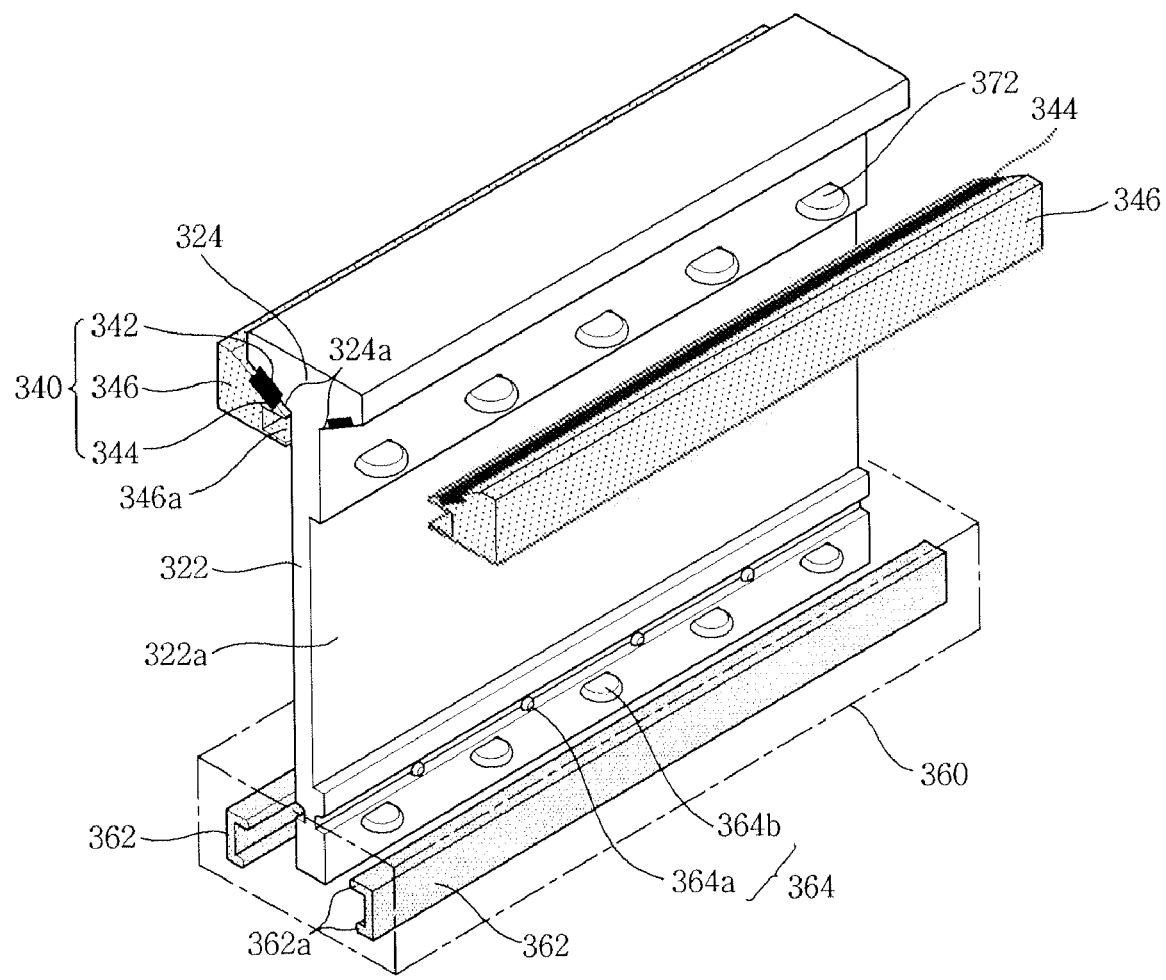
FIG. 10 illustrates a squint view of an apparatus for transferring substrates illustrated in FIG. 9.
Figure 11:
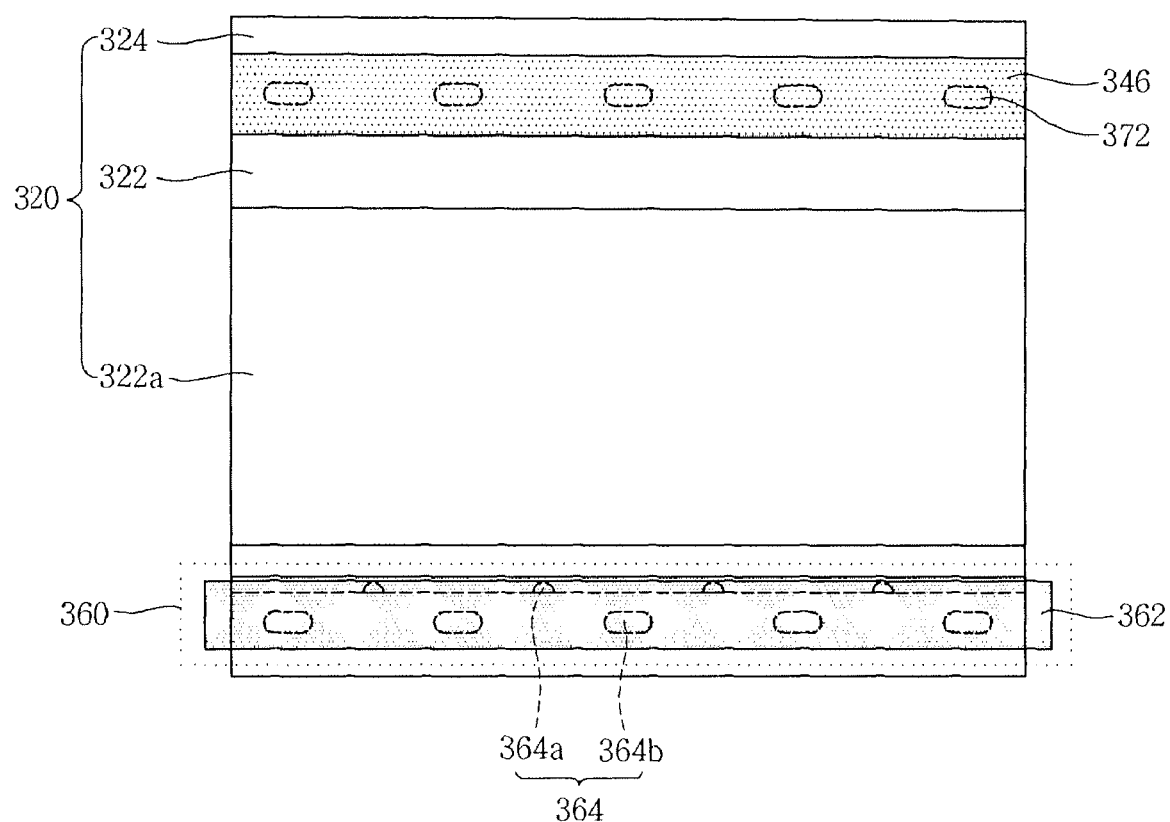
FIG. 11 illustrates a front view of an apparatus for transferring substrates illustrated in FIG. 9.

FIG. 9 illustrates a cross section of an apparatus for transferring substrates according to a third embodiment of the invention. FIG. 10 illustrates a squint view of an apparatus for transferring substrates illustrated in FIG. 9 and FIG. 11 illustrates a front view of an apparatus for transferring substrates illustrated in FIG. 9.

The structure of an apparatus for transferring substrates according to the third embodiment of the invention is a combination of the structure of an apparatus for transferring apparatus according to the first embodiment and the structure of an apparatus for transferring substrates according to the second embodiment, having both a lower damper unit 360 and an upper damper unit 370 at the lower and upper body of a carrier 320.

Referring to FIG. 9 to be more specific, an apparatus for transferring substrates according to the third embodiment of the invention includes a carrier 320 to which substrates 310 are loaded; an upper transfer unit 330 transferring the carrier 320 horizontally by applying thrust to the carrier 320, a lower transfer unit 350 maintaining the lower body of the carrier 320 at the horizontal in a non-contact status, a magnetic levitation module 340 levitating the carrier 320 magnetically, a lower damper unit 360 maintaining the lower center of gravity of the carrier 320 levitated by the magnetic levitation module 340, and an upper damper unit 370 for maintaining the upper center of gravity of the carrier 320 levitated by the magnetic levitation module 340.

The carrier 320 includes a body 322 to which a substrate 310 is mounted vertically and a head 324 having an inclination part 324A whose diameter enlarges along upward direction at the upper part of the body 322.

Inside the body 322, a loading unit 322A for loading a substrate 310 is prepared.

Since the above carrier 320 transfers a substrate 310 by mounting the substrate 310 vertically as shown in the figure, it is effective from the standpoint of space utilization and substrate drooping.

The substrate 310 maybe for manufacturing flat panel displays as well as liquid crystal displays, which may further include the case of a semiconductor wafer.

The upper transfer unit 330 applies thrust to the carrier 320 by using timing belt, rack and pinion gear, roller, ball screw, or linear motor, thereby transferring the carrier 320 horizontally.

In particular, when a linear motor is employed, the carrier 320 can be transferred horizontally in a non-contact way.

As illustrated in FIGS. 9 and 10, the magnetic levitation module 340 is so structured that levitation force is generated by push force established between magnets.

So to speak, the magnetic levitation module 340 includes a first permanent magnet 342 formed at the head 324 of the carrier 320 along the inclination part 324A, a second permanent magnet 344 installed opposite to the first permanent magnet 342, and a supporting member 346 supporting the second permanent magnet 344.

Since the second permanent magnet 344 has actually the same polarity as the first permanent magnet 342, push force is generated pushing the second permanent magnet 344 from the first permanent magnet 342.

The second permanent magnet 344 follows the size and shape of the first permanent magnet 342. The first permanent magnet 342 is either a single long magnet formed at the head 324 of the carrier 320 along the inclination part 324A or a set of magnets of a fixed size installed along the inclination part 324A.

A supporting member 346 is installed at the lower body of the head 324 separated from the inclination part 324A. The upper surface of the supporting member 346 facing the inclination part 324A is inclined parallel to the inclination part 324A and the side surface of the supporting member 346 facing the carrier 320 has a groove 346A.

The lower transfer unit 350 maintains the carrier 320 at the horizontal being levitated magnetically from the ground by using push force between magnets.

The above lower transfer unit 350 includes a third permanent magnet 352 installed in the lower body of the carrier 320 and a fourth permanent magnet 354 installed opposite to the third permanent magnet 352 and have polarity different from the third permanent magnet 352.

Since the fourth permanent magnet 354 is fixed to the bottom surface within a process chamber 300, the carrier 320 is maintained at the horizontal in a non-contact status by pull force exercised between the fourth permanent magnet 354 and the third permanent magnet 352.

At this time, the magnetic levitation module 340 and the lower transfer unit 350 require control of levitation force by adjusting levitation gap according to the weight of the carrier 320.

For example, if push force exercised by the magnetic levitation module 340 is strong relative to with the weight of the carrier 320 whereas pull force exercised by the lower transfer unit 350 is weak relative to the push force, the lower body of the carrier 320 levitated magnetically may not be kept at the horizontal in a non-contact status, being inclined in one direction or displaced from the normal position.

The lower damper unit 360 is intended for controlling levitation gap of the carrier 320, including a lower housing 362 encompassing both parts of the lower body of the carrier 320, multiple dampers 364 installed inside the lower housing 362, and hooks 362A installed at the upper and lower part of the lower housing 362.

At this time, hooks 362A restrict levitation force of the carrier 320 levitated magnetically, thereby preventing the carrier 320 from being inclined in one direction due to magnetic force (push and pull force) exercised through the magnetic levitation module 340 and the lower transfer unit 350.

Multiple lower dampers 364 can be installed in the form of a roller and can include a first lower damper 364A installed between the hook 362A and the carrier 320 to reduce friction against the carrier 320 inside the lower housing 362 and a second lower damper 364B installed between the side surface of the carrier 320 and the lower housing 362.

Since installation structure of multiple lower dampers 362 and interaction of the multiple lower dampers 362 with the lower housing are the same as described in the first embodiment, detailed descriptions are omitted.

The lower damper unit 360 structured as above prevents the carrier 320 from being inclined in one direction or displaced by maintaining the lower center of gravity of the carrier 320 levitated magnetically and prevents generation of particles by minimizing friction between the carrier 320 and the lower housing 362.

The upper damper unit 370 is intended for preventing the carrier 320 levitated by the magnetic levitation module 340 and the lower transfer unit 350 from being inclined towards both sides by lateral force, the upper damper unit 270 including multiple upper dampers 372 installed along horizontal direction of the carrier 320.

The carrier 320 obtains stable levitation force while maintaining levitation gap by utilizing the lower transfer unit 350 and the lower damper unit 360. As levitation force becomes large, however, lateral force is bound to be generated, by which the carrier 320 gets inclined to both sides.

Accordingly, the upper dampers 372 of the damper unit 370 are located between the supporting member 346 of the magnetic levitation module 340 and surfaces of the upper dampers 372 facing each other are installed in such a way to make contact with the carrier 320 and the magnetic levitation module 340, respectively.

At this time, a groove (not shown) into which part of the upper dampers 372 are inserted can be formed in the contacting surface of the carrier 320 with which multiple upper dampers 372 make contact.

Based on the structure above, since the upper damper unit 370 maintains the upper center of gravity of the carrier 320 (which has levitated while preserving some levitation gap) at the center between both sides against lateral force in order for the carrier 320 not to collide against the sides, generation of particles due to friction can be prevented.

Therefore, an apparatus for transferring substrates according to the third embodiment of the invention transfers the carrier 320 in a non-contact way by levitating the carrier 320 magnetically by using magnetic force through the magnetic levitation module 340 and the lower transfer unit 350 and maintains levitation gap by using the lower damper unit 360 of the carrier 320 to secure stable levitation force. Moreover, the apparatus prevents generation of particles due to friction between the carrier 320 and the magnetic levitation module 340 by maintaining the upper center of gravity of the carrier 320 against lateral force generated together with levitation force.

In other words, a stable transfer system is provided by eliminating all the causes of generation of particles.

As described in detail above, an apparatus for transferring substrates according to one embodiment of the invention, by levitating magnetically the upper and lower part of a carrier holding a substrate vertically by using push force between magnets, brings an effect of transferring the substrate horizontally in a not-contact way. Accordingly, since friction force during transfer of substrates becomes minimized, adverse effect due to particles can be avoided.

Also, as the upper and lower center of gravity of a carrier are maintained by applying dampers to the upper and lower part of the carrier levitated magnetically, one can obtain an effect of preventing generation of particles due to friction and providing a stable transfer system.

Further, by maintaining a constant levitation gap of a carrier, one can obtain an effect of adjusting levitation force that can be varied according to the weight of the carrier.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. An apparatus for transferring substrates, comprising:
   a carrier to which substrates are loaded;
   an upper transfer unit transferring the carrier horizontally by applying thrust to the carrier;
   a lower transfer unit maintaining the lower body of the carrier at the horizontal in a non-contact status;
   a magnetic levitation module levitating the carrier magnetically; and
   an upper damper unit maintaining the upper center of gravity of the carrier levitated by the magnetic levitation module and including multiple dampers,
   wherein the multiple dampers are installed in such a way that the carrier and the magnetic levitation module respectively make contact with surfaces of the multiple dampers opposite to each other, and
   wherein the multiple dampers are a roller rotating around an axis having direction orthogonal to the direction along which the carrier is installed.

2. The apparatus of claim 1, wherein the carrier comprises,
   a body to which the substrate is mounted vertically; and
   a head having an inclination part whose diameter enlarges along upward direction at upper part of the body.

3. The apparatus of claim 2, wherein the magnetic levitation module comprises,
   a first permanent magnet installed at the inclination part of the head;
   a second permanent magnet installed opposite to the first permanent magnet, having actually the same polarity as the first permanent magnet; and
   a supporting member supporting the second permanent magnet.

4. The apparatus of claim 3, wherein the supporting member contacting the multiple dampers has a groove into which the multiple dampers can be inserted.

5. The apparatus of claim 1, wherein the upper transfer unit is a linear motor.

6. The apparatus of claim 1, wherein the lower transfer unit comprises,
   a third permanent magnet installed at the lower part of the carrier; and
   a fourth permanent magnet installed opposite to the third permanent magnet, having different polarity from the third permanent magnet.

7. The apparatus of claim 1, wherein the multiple dampers are installed to both sides of the carrier.

8. The apparatus of claim 1, wherein the multiple dampers are installed by penetrating the carrier.

9. An apparatus for transferring substrates, comprising:
   a carrier to which substrates are loaded;
   an upper transfer unit transferring the carrier horizontally by applying thrust to the carrier;
   a lower transfer unit maintaining the lower body of the carrier at the horizontal in a non-contact status;
   a magnetic levitation module levitating the upper body of the carrier magnetically;
   a lower damper unit maintaining the lower center of gravity of the carrier levitated by the magnetic levitation module; and
   an upper damper unit maintaining the upper center of gravity of the carrier levitated by the magnetic levitation module and including multiple dampers,
   wherein the multiple dampers are installed in such a way that the carrier and the magnetic levitation module respectively make contact with surfaces of the multiple dampers opposite to each other, and
   wherein the multiple damper is a roller rotating around an axis having direction orthogonal to the direction along which the carrier is installed.

* * * * *